(12) United States Patent
Zhang

(10) Patent No.: US 10,193,519 B2
(45) Date of Patent: Jan. 29, 2019

(54) ANALOG PHASE SHIFTER AND A METHOD FOR SHIFTING PHASE OF RF SIGNALS

(71) Applicant: Cemin Zhang, Diamond Bar, CA (US)

(72) Inventor: Cemin Zhang, Diamond Bar, CA (US)

(73) Assignee: Cemin Zhang, Diamond Bar, CA (US)

( * ) Notice: Subject to any disclaimer, the term of this patent is extended or adjusted under 35 U.S.C. 154(b) by 0 days.

(21) Appl. No.: 15/679,690

(22) Filed: Aug. 17, 2017

(65) Prior Publication Data

US 2018/0375486 A1    Dec. 27, 2018

(30) Foreign Application Priority Data

Jun. 22, 2017   (CN) .......................... 2017 1 0483578

(51) Int. Cl.
| | |
|---|---|
| *H03H 7/20* | (2006.01) |
| *H03H 7/19* | (2006.01) |
| *H01P 1/18* | (2006.01) |

(52) U.S. Cl.
CPC ................ *H03H 7/20* (2013.01); *H01P 1/18* (2013.01); *H03H 7/19* (2013.01)

(58) Field of Classification Search
CPC . H04L 1/00; H04L 67/28; H04L 43/10; H04L 45/38; H04L 67/10
USPC .......................... 327/231, 232; 333/167, 173
See application file for complete search history.

(56) References Cited

U.S. PATENT DOCUMENTS

| | | | |
|---|---|---|---|
| 4,961,062 A | 10/1990 | Wendler | |
| 7,276,993 B2 | 10/2007 | York | |
| 8,610,477 B2 * | 12/2013 | Koechlin | H03H 7/19 327/231 |
| 2006/0067254 A1 * | 3/2006 | Mahbub | H03H 9/0576 370/282 |
| 2008/0042774 A1 * | 2/2008 | Talbot | H03F 1/56 333/33 |
| 2011/0267119 A1 * | 11/2011 | Koechlin | H03H 7/19 327/158 |

OTHER PUBLICATIONS

Product: HMC932LP4E. Available from Internet, <URL:http://www.analog.com/cn/products/rf-microwave/phase-shifters-vector-modulators/analog-phase-shifter/hmc932.html/> (9 pgs).
Ex parte Qualye mailed Jul. 25, 2018, in U.S. Appl. No. 15/679,690 (11 pgs).
Response to Ex parte Quayle filed Sep. 20, 2018, in related U.S. Appl. No. 15/679,690 (4 pgs).

* cited by examiner

*Primary Examiner* — John W Poos
(74) *Attorney, Agent, or Firm* — North Weber & Baugh LLP

(57) ABSTRACT

This invention relates to analog phase shifters, and more particularly, to analog phase shifters for controlling the phase of an RF signal over a wide range of frequencies with nearly linear phase change. An exemplary phase shifter includes a front end high-low pass filter, a back-end high-low pass filter, and an all-pass filter coupled in series between the two high-low pass filters. At least one of the filters is tunable for controlling the phase of an input signal over a wide range of frequencies. The high-low pass filter comprises low-pass filters as input and output interface for the high-low pass filter to facilitate impedance match for receiving and outputting RF signal.

20 Claims, 5 Drawing Sheets

ANALOG PHASE SHIFTER AND A METHOD
FOR SHIFTING PHASE OF RF SIGNALS

CROSS-REFERENCE TO RELATED
APPLICATIONS

This application claims foreign priority to Chinese Patent Application No. 201710483578.0, entitled "An Analog Phase Shifter and a Method for Shifting Phase of RF Signals", naming Cemin Zhang as inventor, and filed Jun. 22, 2017, the subject matter of which is hereby incorporated herein by reference.

TECHNICAL FIELD

The present invention relates generally to an analog phase shifter, and more particularly to an analog phase shifter for controlling the phase of an RF signal over a wide range of frequencies with nearly linear phase change.

BACKGROUND OF THE INVENTION

In many applications, it is desirable to control the phase of a signal over a wide range of frequencies with nearly linear phase change with input control voltage (or current). It is advantageous to have a constant or nearly constant phase tuning sensitivity over the entire operating frequency range. This is useful when it is necessary to phase modulate signals over a wide range of frequencies with the goal of obtaining a phase modulation independent or relatively independent of frequency for the same input stimulus. In addition it is also desirable to achieve the wideband phase modulation performance with relatively low and flat insertion loss.

Various efforts have been explored for wideband analog phase shifters incorporated with one or more all pass filter (APF). A single all-pass filter by itself would not provide a flat response over a range of frequencies, but by cascading multiple all-pass sections tuned at different center frequencies, the cumulative phase shift response curves results in a composite frequency-phase response that may provide a relatively flat phase over a specified range of frequencies. However, there are drawbacks from cascading multiple all-pass sections centered at different frequencies. Multiple all-pass sections at the same (or similar) center frequency may be required to provide a desired overall phase shift range due to the limited phase shift range for a single all-pass section. This may result in the insertion loss by a factor of two or more.

Accordingly, there is a need for an analog phase shifter for controlling the phase of an RF signal over a wide range of frequencies with nearly linear phase change.

DESCRIPTION OF THE INVENTION

The invention relates to secure systems and modules, and more particularly, to systems, devices and methods for controlling the phase of an RF signal over a wide range of frequencies with nearly linear phase change.

Various efforts have been explored for wideband analog phase shifters incorporated with one or more all pass filter (APF). FIG. 1 is a prior art diagram illustrating an analog phase shifter 30 disclosed in U.S. Pat. No. 8,610,477. As shown in FIG. 1, the phase shifter 30 includes a low-pass filter 32, an all-pass filter 34 and a high-pass filter 36 cascaded in series. The all-pass filter section 34 is placed between low-pass filter 32 and high-pass filter 36. Both the low-pass filter 32 and the high-pass filter 36 are fifth order tunable filters. The low-pass filter 32 is preferably designed to have a cut-off frequency at or above the highest frequency in the frequency pass band of the analog phase shifter. The High-pass filter 36 is designed to have a cut-off frequency at or below the lowest frequency in the frequency pass band of analog phase shifter 30. The center frequency of all-pass filter 34 may be located near the center frequency of phase shifter 30, and is slightly closer to the low frequency band to compensate for the abrupt phase-frequency response of high-pass filter 36 thus providing a flat phase response as a function of the frequency.

By introducing one stage of APF section between the low-pass and high-pass sections, the phase shifter disclosed in U.S. Pat. No. 8,610,477 provides more phase shift at the center of frequency and improves the phase shift flatness over a wide frequency range. The prior art phase shifter still has drawbacks which limits its application. By principle, all-pass filter has worst matching with external circuit. High-pass filter has better matching than APF, but worse than LPF. LPF generally has the best matching because it has lumped model resemble the transmission line model. As disclosed in U.S. Pat. No. 8,610,477, the HPF coupled to the APF still has interfere with external circuitry, which degrades matching especially when operating frequency gets higher. Furthermore, the prior art phase shifter has non-symmetric S11 and S22 scattering parameters, which adds more design complexity.

To overcome the above drawbacks, following technical schemes have been implemented in the present invention:

An analog phase shifter, comprising:

a first high-low pass filter comprising a first low-pass filter (LPF) section, a second LPF section, and a first high-pass filter (HPF) section coupled in series between the first LPF section and the second LPF section, the first LPF section coupled to receive an RF input signal, the second LPF section outputs an output signal of the first high-low pass filter;

an all-pass filter (APF) coupled to receive the output signal of the first high-low pass filter and output an APF output signal;

a second high-low pass filter comprising a third LPF section, a fourth LPF section, and a second HPF section coupled in series between the third LPF section and fourth LPF section, the third LPF section coupled to receive the APF output signal, the fourth LPF section outputs an RF output signal.

Further, the first LPF section and the fourth LPF section are symmetrical around the APF, the second LPF section and the third LPF section are symmetrical around the APF.

Further, the first and second high-low pass filters comprise multiple LPF and HPF sections cascaded in series and alternatively.

Further, the second LPF section and the third LPF section are high-order low pass filter.

Further, the first high-low pass filter and the second high-low pass filter are symmetrical around the all-pass filter.

Further, the first high-low pass filter, the APF, and the second high-low pass filter are coupled to receive a common DC tuning signal for tuning.

Further, the first high-low pass filter, the APF, and the second high-low pass filter are each coupled to receive an individual DC tuning signal.

Further, the first high-low pass filter, the APF, and the second high-low pass filter are each coupled to receive the individual DC tuning signal via the bias resistor and an inductor coupled in series to the bias resistor.

A method for RF signal phase shifting, comprising:
receiving an input RF signal, at a first high-low pass filter, the first high-low filter comprising a first low-pass filter (LPF) section, a first high-pass filter (HPF) section and a second LPF section sequentially coupled in series, the first LPF section facilitates impedance match for the first high-low filter to receive the input RF signal;

receiving, at an all-pass filter (APF), an output signal of the first high-low pass filter from the second LPF section;

receiving, at a second high-low pass filter, an output of the APF, the second high-low filter comprising a third low-pass filter (LPF) section, a second HPF section, and a fourth LPF section sequentially coupled in series, the third LPF section facilitates a match between the second high-low pass filter and the APF; and outputting an RF output signal from the fourth LPF section of the second high-low pass filter.

Further, the first high-low pass filter, the APF, and the second high-low pass filter are tunable and coupled to receive a common DC tuning signal for tuning.

In some embodiments, this invention features an analog phase shifter, including a first high-low pass (HLP) filter to receive an RF input signal, a second high-low pass filter to output an RF output signal, and an all-pass filter (APF) coupled in series between the first high-low pass filter and the second high-low pass filter. The featured analog phase shifter is tunable for controlling the phase of a signal over a wide range of frequencies. The first HLP filter and the second HLP filter function to prevent the APF from interfacing with external circuitry. The first high-low pass filter and the second high-low pass filter have a series cascaded structure comprising a first low-pass filter (LPF) section, a second LPF section and a high-pass filter (HPF) section coupled in between. Furthermore, the APF is coupled directly between a LPF section of the first HLP filter and a LPF section of the second HLP filter. Such arrangement also prevents the APF from interfering with the HPF sections of the first and the second HLP filters.

In some embodiments, the LPF section of the first HLP filter and the LPF section of the second HLP filter coupled directly to the APF are second order filters comprising one inductor and one capacitor. In some embodiments, the LPF section of the first HLP filter and the LPF section of the second HLP filter coupled directly to the APF are fifth order filters comprising three inductors and two capacitors. The adoption of fifth order LPF sections may produce added phase shift range and wider frequency range, but at the cost of added insertion loss compared to second order LPF sections.

In some embodiments, the all-pass filter (APF), the first high-low pass filter and the second high-low pass filter comprise one or more variable capacitors for tuning the phase of the RF input signal. The variable capacitors may each include or be a varactor diode, the capacitance of which is tunable in response to a common DC tuning signal via respective bias resistors.

In some embodiments, the all-pass filter (APF), the first high-low pass filter and the second high-low pass filter comprise one or more variable capacitors for tuning the phase of the RF input signal. The variable capacitors may each include a varactor diode, the capacitance of which is tunable in response to a common DC tuning signal via respective bias resistors. In some embodiments, a choke inductor Lc may be added in series with each bias resistor to provide enhanced DC-RF isolation.

In some embodiment, the variable capacitors of the all-pass filter (APF), the first high-low pass filter and the second high-low pass filter are coupled to respective DC source such that each filter may be tuned individually. Each DC source may be set at different voltage level to meet respective tuning requirement and improve the overall IP3 (third-order intercept point, an index to measure the linearity of a system or device in telecommunication) of the phase shifter. Furthermore, the choke inductor Lc and the bias resistor Rbias coupled to each VDC node can also have different value to provide optimized DC-RF isolation performance for each filter.

In some embodiments, wire bond inductors that connect to RF input/output ports are incorporated as part of HLP filters, more specifically as part of the LPF section for each LPF filter, to facilitate input/output matching. Such a configuration increase the practicality of filter in Monolithic Microwave Integrated Circuit (MMIC) die for assembling into a surface mount package.

In some embodiments, the first high-low pass (HLP) filter and the second high-low pass filter are cascaded filters comprising multiple high-pass filter (HPF) sections and low-pass filter (LPF) sections alternatively coupled in series, with a low-pass filter section in both ends. Such a configuration provides flexibility of selecting filter order number for each LPF and HPF section. Larger filter order number generally gives more bandwidth and phase shift range, although with traded-off of insertion loss. Similarly, more sections give more bandwidth and phase shift range, also with traded-off of insertion loss. Furthermore, the first and second HLP filters may be symmetrical/identical with the LPF sections coupling to external circuitry, such that the phase shifter may have improved matching and symmetrical S11/S22, thus is easier for circuit design.

One skilled in the art will recognize that the high-low pass filter and the APF may be configured with various architectures. One skilled in the art will further recognize that the first high-low pass filter, second high-low pass filter and the APF may be disposed on a common semiconductor die or separate semiconductor dies. Such variations should fall within the scope of the present invention.

DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are used for analog phase shifters to control the phase of an RF signal over a wide range of frequencies with nearly linear phase change. The analog phase shifter may comprise one or more filter modules or components coupled together for the phase shifting functionality. These filter modules or components may be integrated on a single substrate or contain discrete components. Furthermore, the disclosed analog phase shifters may be integrated with other components on a common substrate or separate substrates.

Embodiment 1

Figure 1:
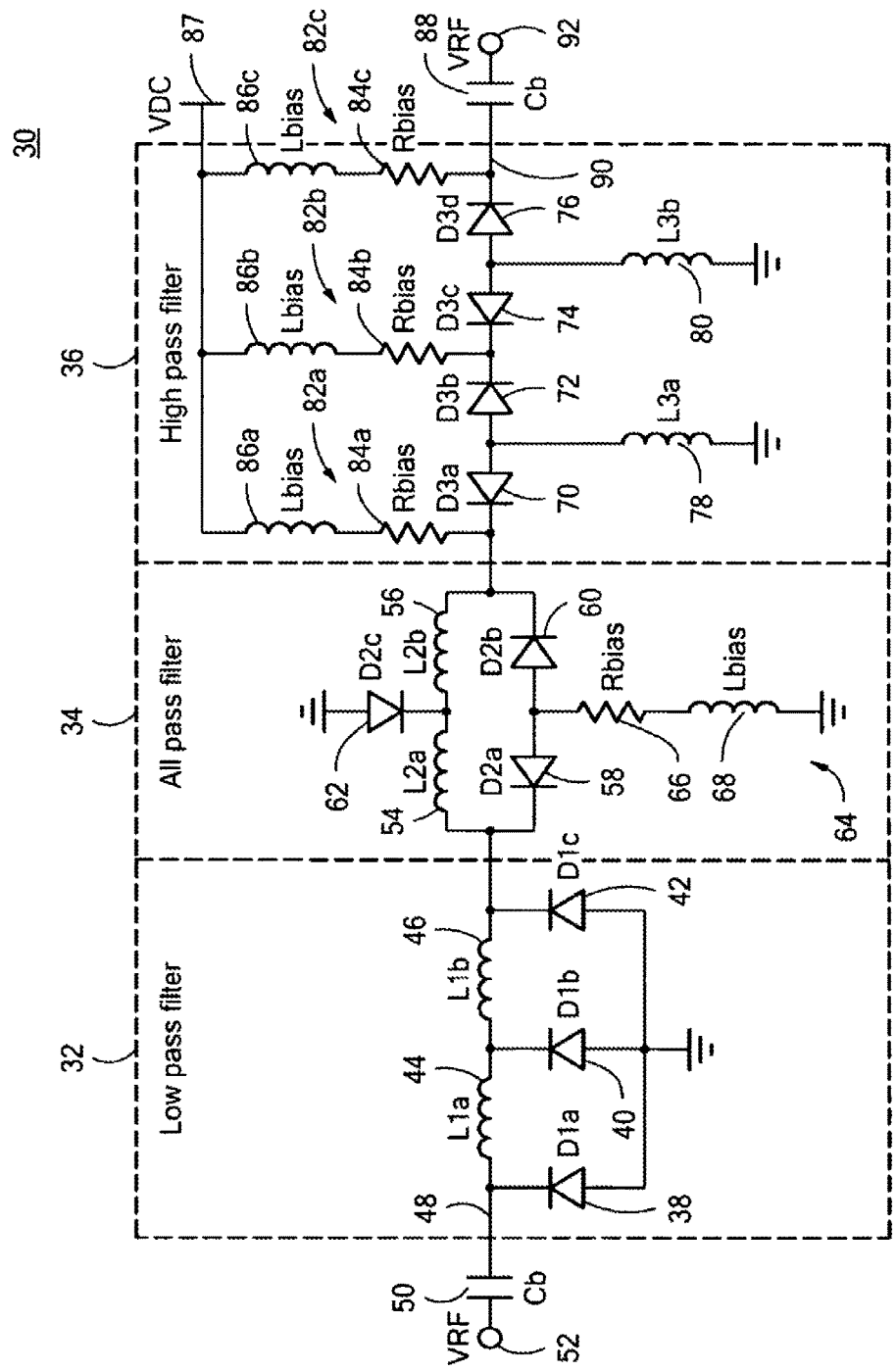
FIG. 1 is a prior art diagram illustrating an analog phase shifter.
Figure 2:
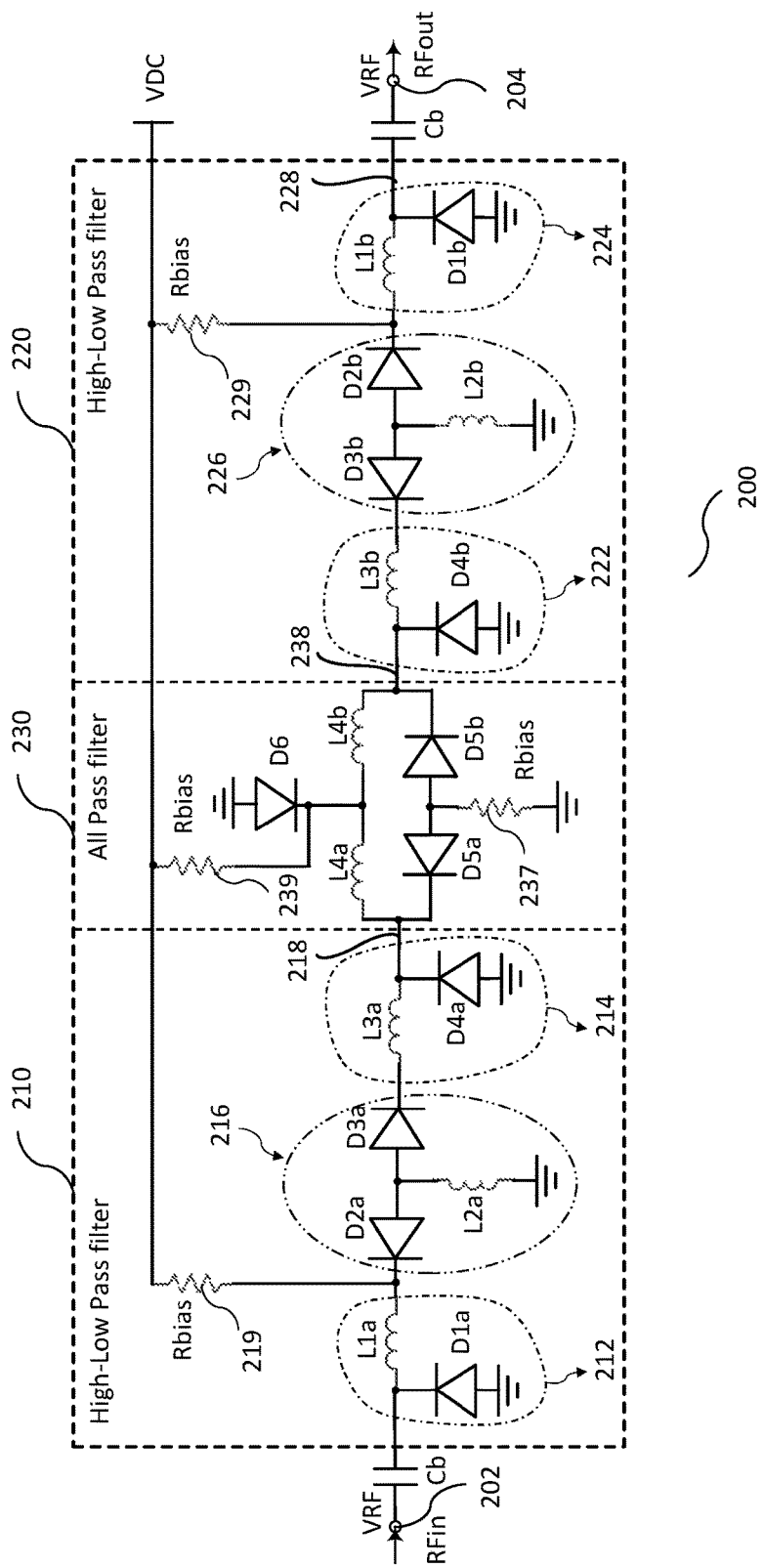
FIG. 2 is an analog phase shifter comprising a first high-low pass filter, a second high-low pass filter and an all-pass filter coupled between the first high-low pass filter and the second high-low pass filter according to one embodiment of the invention.

FIG. 2 is an analog phase shifter 200 according to one embodiment of the invention to overcome the above drawbacks. The analog phase shifter 200 comprises a first high-low pass (HLP) filter 210, a second HLP filter 220, and an all-pass filter (APF) 230 coupled in series between the first high-low pass filter 210 and the second HLP filter 230 to assist phase shift tuning. The first HLP filter 210 receives an input RF signal $RF_{in}$ from an input terminal 202 and outputs a first HLP output signal 218. The APF 230 receives the first HLP output signal 218 and outputs an APF output signal 238. The second HLP filter 220 receives APF output signal 238 and outputs an output RF signal $RF_{out}$ via an output terminal 204. The output RF signal $RF_{out}$ has a controllable and adjustable relative phase shift over the input RF signal $RF_{in}$. A fixed capacitor Cb may couple between the first HLP filter 210 and the input terminal 202 for the purpose of DC blocking. A fixed capacitor Cb may also couple between the second HLP filter 220 and the output terminal 204 for the same DC blocking purpose. The first HLP filter 210 and the second HLP filter 220 are preferred to be symmetric around the APF 230, such that the phase shifter may have improved matching and symmetrical S11/S22, thus is easier for circuit design and user applications.

The first high-low pass filter 210, which may also be referred as a front-end filter, includes a first low-pass filter (LPF) section 212, a second LPF section 214, and a first high-pass filter (HPF) section 216 coupled in series between the first LPF section and the second LPF section. The first LPF section 212, which is also referred as a front-end input interface, functions to facilitate impedance match for the first high-low pass filter 210 (front-end filter) to receive the input RF signal. In some embodiments, the first LPF section 212 is a second order low pass filter comprises an inductor L1a and a capacitor D1a, which may be a variable capacitor, such as a varactor diode, for filter parameter tuning; the second low-pass LPF section 214, which is also referred as a front-end output interface, is also a second order low pass filter comprises an inductor L3a and a capacitor D4a, which may be a variable capacitor, such as a varactor diode, for filter parameter tuning. The first HPF section 216 comprises two variable capacitor elements D2a and D3a in series with the RF signal path, and an inductor element L2a in shunt with the RF signal path.

Similarly, the second high-low pass filter 220, which may also be referred as a back-end filter, includes a third low-pass filter (LPF) section 222 (also referred as a back-end input interface), a fourth LPF section 224, and a second high-pass filter (HPF) section 226 coupled in series between the third LPF section and the fourth LPF section. The fourth LPF section 224, which is also referred as a back-end output interface, functions to facilitate impedance match between the second high-low pass filter 220 (back-end filter) and external circuit (not shown in the Figure) for the output of the output RF signal. In some embodiments, the third LPF section 222 is a second order low pass filter comprises an inductor L3b and a capacitor D4b, which may be a variable capacitor, such as a varactor diode, for filter parameter tuning; the fourth low-pass LPF section 224 is also a second order low pass filter comprises an inductor L1b and a capacitor D1b, which may be a variable capacitor, such as a varactor diode, for filter parameter tuning. The second HPF section 226 comprises two variable capacitor elements D2b and D3b in series with the RF signal path, and an inductor element L2b in shunt with the RF signal path.

In some embodiments, the first LPF section 212 and the fourth filter 224 are symmetric or mirror structures of each other. The second LPF section 214 and the third filter 222 are symmetric or mirror structures of each other. Such configuration ensures a symmetrical S11/S22 of the phase shifter 200. Furthermore, the first LPF section 212 and the second filter 214 may be configured as symmetric structures around the first HPF section 216; the third LPF section 222 and the fourth filter 224 may be configured as symmetric structures around the second HPF section 226.

In some embodiments, the first LPF section 212 has a first low-pass (LP) cutoff frequency (the frequency when the first LPF attenuates the input power by half or 3 dB) above the frequency range of the input RF signal. The second LPF section 214 has a second LP cutoff frequency also above the frequency range of the input RF signal. The second LP cutoff frequency may or may not be the same as the first LP cutoff frequency. The first HPF section 216 has a first high-pass (HP) cutoff frequency below the frequency range of the input RF signal. The second HPF section 226 has a second HP cutoff frequency also below the frequency range of the input RF signal. Such arrangements ensure that the RF input signal has a frequency or frequency range between the HP cutoff frequency and the LP cutoff frequency. Furthermore, the second HP cutoff frequency may or may not be the same as the first HP cutoff frequency. The third LPF section 222 may have a third LP cutoff frequency same as the second LP cutoff frequency of the second LPF section 214. The fourth LPF section 224 may have a fourth LP cutoff frequency same as the first LP cutoff frequency of the first LPF section 212. Such configuration ensures that the phase shifter 200 not only has symmetric structures but also has symmetric operating parameters.

Furthermore, the APF 230 has an operating frequency range covering the frequency range of the input RF signal. The operating frequency range of the APF 230 may or may not have overlap with the low pass range of the LPF sections and the high pass range of HPF sections. In one embodiment, the APF 230 has a center frequency (e.g., logarithm center frequency) aligning with the frequency of the input RF signal. For one example, when an input RF signal has a frequency of 2 GHz, the APF 230 has a center frequency set as 2 GHz. For another example, when an input RF signal has a frequency range between 2 GHz and 3 GHz, the APF 230 has a center frequency set as 2.45 GHz (logarithm center between 2 GHz and 3 GHz) and also an operating frequency range cover the range between 2 GHz and 3 GHz. The aforementioned cutoff frequencies for the LPF sections, HPF sections and APF in the phase shifter 200 may also applicable to the phase shifter 300, 400 or 500.

As shown in FIG. 2, the APF 230 includes two fixed inductors L4a and L4b in parallel with two variable capacitors D5a and D5b. A shunt variable capacitor D6 is coupled to ground from a junction between the inductors L4a and L4b. The capacitance of variable capacitors D5a and D5b are preferably identical and roughly half of the capacitance of the variable capacitor D6. A shunt resistance Rbias 237 couples between ground and the junction of variable capacitors D5a and D5b to provide a DC return path for variable capacitors D5a and D5b. The APF 230 is coupled between the second LPF section 214 of the first HLP filter 210 and the third LPF section 222 of the second HLP filter 220, thus preventing the APF 230 from interfacing with external circuit and also preventing the APF from coupling to the HPF sections 216 and 226 directly.

In some embodiments, the first HLP filter 210, the second HLP filter 220, and the APF 230 couple to a common DC bias source VDC for tuning. Specifically, the VDC couples to a junction between the first LPF section 212 and the first HPF section 216 via a resistor Rbias 219. The VDC also couples to a junction between the fourth LPF section 224 and the second HPF section 226 via a resistor Rbias 229. The VDC further couples to the variable capacitor D6 of the APF 230 via a resistor Rbias 239. The resistors 219, 229, and 239 may have the same resistance or different resistance values for individual tuning.

Embodiment 2

Figure 3:
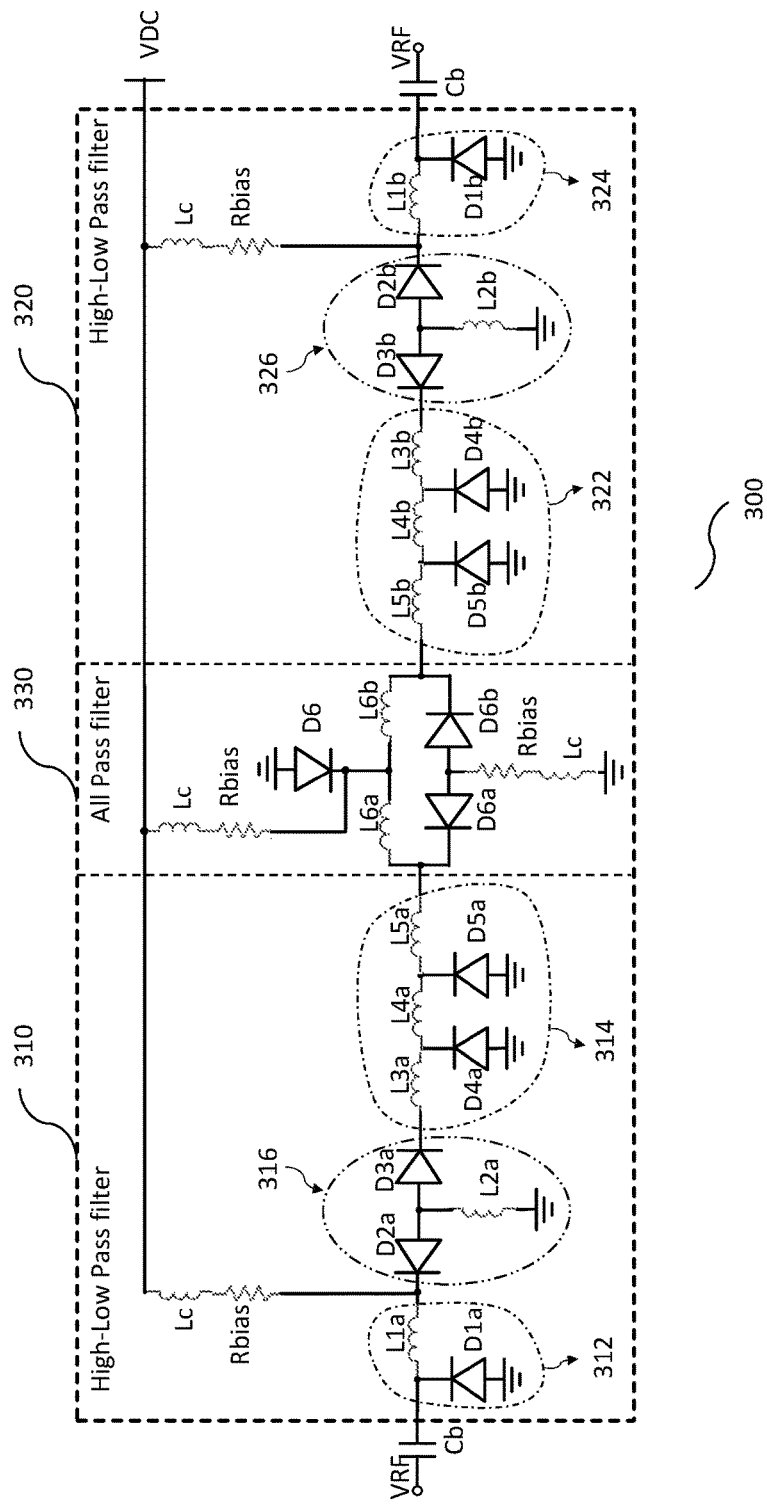
FIG. 3 is an analog phase shifter comprising a first high-low pass filter, a second high-low pass filter and an all-pass filter according to another embodiment of the invention.

FIG. 3 is an analog phase shifter 300 comprising a first high-low pass filter 310, a second high-low pass filter 320 and an all-pass filter 330 according to another embodiment of the invention. The analog phase shifter 300 is similar to the analog phase shifter 200 shown in FIG. 2, except a few differences. The first high-low pass filter 310 includes a first low-pass filter (LPF) section 312, a second LPF section 314, and a first high-pass filter (HPF) section 316 coupled in series between the first LPF section 312 and the second LPF section 314. The second high-low pass filter 320 includes a third low-pass filter (LPF) section 322, a fourth LPF section 324, and a second high-pass filter (HPF) section 326 coupled in series between the third LPF section 322 and the fourth LPF section 324. Unlike the second LPF section 214 and the third LPF section 222 shown in FIG. 2, the second LPF section 314 and the third LPF section 322 are fifth order LPFs instead of second order LPFs. The adoption of fifth order LPF sections 314 and 322 may produce added phase shift range and wider frequency range, but at the cost of added insertion loss compared to second order LPF sections.

As shown in FIG. 3, the APF 330 is also a fifth order all pass filter, similar to APF 230. The APF 330 includes two fixed inductors L6a and L6b in parallel with two variable capacitors D6a and D6b. A shunt variable capacitor D6 is coupled to ground from a junction between the inductors L6a and L6b. The capacitance of variable capacitors D6a and D6b are preferably identical and roughly half of the capacitance of the variable capacitor D6. A shunt branch, comprising a shunt resistance Rbias 337 and an inductor Lc 336 connected in series, couples between ground and the junction of variable capacitors D6a and D6b to provide a DC return path for variable capacitors D6a and D6b. The APF 330 is coupled between the second LPF section 314 of the first HLP filter 310 and the third LPF section 322 of the second HLP filter 320, thus preventing the APF 330 from interfacing with external circuit and also preventing the APF from coupling to the HPF sections 316 and 326 directly.

Furthermore, the first HLP filter 310, the second HLP filter 320, and the APF 330 couple to a common DC bias source VDC via respective resistor Rbias and a choke inductor Lc added in series with Rbias. The choke inductor Lc is added to provide enhanced DC-RF isolation.

The analog phase shifter 300 remains a symmetric configuration with the first HLP filter 310 and the second HLP filter 320 symmetric around the APF 330. Therefore, the analog phase shifter 300 still has a symmetrical S11/S22 parameter. However, the first HLP filter 310 and the second HLP filter 320 themselves are no longer symmetric because the LPF sections 312 and 324 are different from the LPF sections 314 and 322.

Embodiment 3

Figure 4:
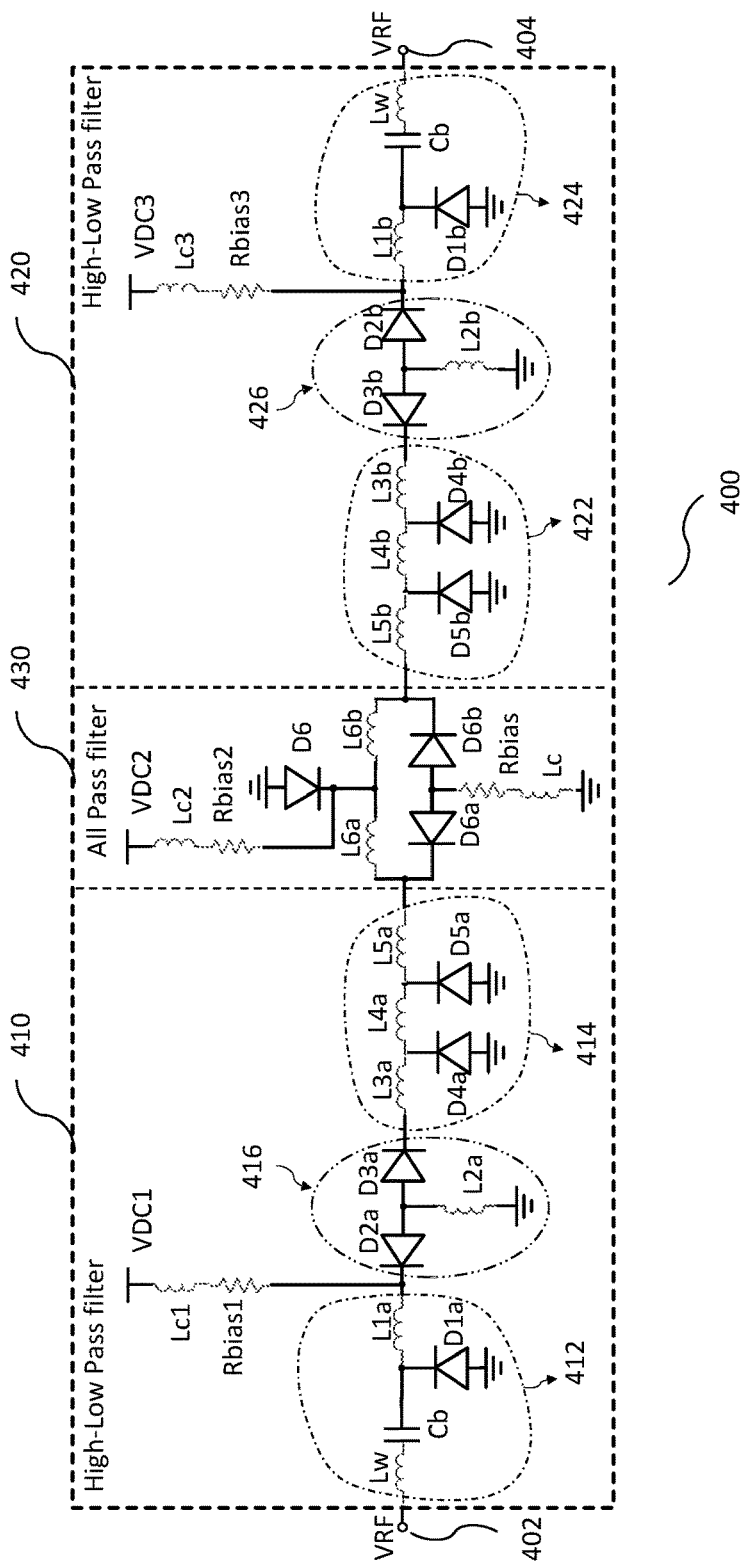
FIG. 4 is an analog phase shifter with incorporation of wire bond inductors as part of high-low pass filter to facilitate input/output matching according to yet another embodiment of the invention.

FIG. 4 is an analog phase shifter 400 with incorporation of wire bond inductors Lw as part of high-low pass filter to facilitate input/output matching according to yet another embodiment of the invention. Similar to the analog phase shifter 200 shown in FIG. 2, the analog phase shifter 400 also comprises a first HLP filter 410, a second HLP filter 420, and an all-pass filter 430 coupled between the first HLP filter 410 and the second HLP filter 420. The first HLP filter 410 includes a first LPF section 412 (also referred as a front-end input interface) to receive RF input signal via the input terminal VRF 402, a second LPF section 414, and a first HPF section 416 coupled in series between the first LPF section 412 and the second LPF section 414. The second high-low pass filter 420 includes a third LPF section 422, a fourth LPF section 424 (also referred as a back-end output interface) to output RF output signal via the output terminal VRF 404, and a second high-pass filter (HPF) section 426 coupled in series between the third LPF section 422 and the fourth LPF section 424.

Unlike the analog phase shifter 200 shown in FIG. 2 and the analog phase shifter 300 shown in FIG. 3, the first LPF section 412 and the fourth LPF section 424 incorporate wire bond inductors Lw as part of the respective LPF section, to facilitate input/output matching. Such an incorporation increase the practicality of filter in Monolithic Microwave Integrated Circuit (MMIC) die for assembling into a surface mount package. Furthermore, the incorporation of wire bond inductors as one part of the front-end interface (412) and back-end interface (424) provides enhanced phase shift range for the corresponding LPF sections, thus promote the overall performance of the phase shifter.

Another difference separating the phase shifter 400 from the phase shifter 200 and the analog phase shifter 300 is that the first HLP filter 410, the second HLP filter 420, and the all-pass filter 430 are coupled to respective DC sources (VDC1, VDC2 or VDC3) instead of a common DC source. Such configuration ensures that each filter may be tuned individually. Each DC source may be set at different voltage levels to meet respective tuning requirement and improve the overall IP3 (third-order intercept point, an index to measure the linearity of a system or device in telecommunication) of the phase shifter. Furthermore, each filter (410, 420 or 430) couples to its DC source via respective resistor Rbias and a choke inductor Lc added in series with Rbias. Each resistor (Rbias1, Rbias2, or Rbias3) and coupled choke inductor (Lc1, Lc2 or Lc3) can also have different value to provide individualized and optimized DC-RF isolation performance for each filter. The analog phase shifter 400 may remain a symmetric configuration as long as the first HLP filter 410 and the second HLP filter 420 symmetric around the APF 430. Therefore, the analog phase shifter 400 may still has a symmetrical S11/S22 parameter.

One skilled in the art will also recognize that various modifications of the embodiment shown in FIG. 4 may also be applicable. For example, although the first HLP filter 410 and the second HLP filter 420 themselves are not symmetric as shown in FIG. 4, the phase shifter 400 may be modified to make first HLP filter 410 and the second HLP filter 420 still symmetric or near symmetric around respective HPF sections (416 and 426 respectively). Exemplary modifications may be done by making the LPF sections 414 and 422 have the same orders as the LPF sections 412 and 424. The phase shifter 400 may also be modified to make first HLP filter 410, the second HLP filter 420 and the APF 430 coupling to the same DC source. Such modifications are still within the scope of this disclosure.

Embodiment 4

Figure 5:
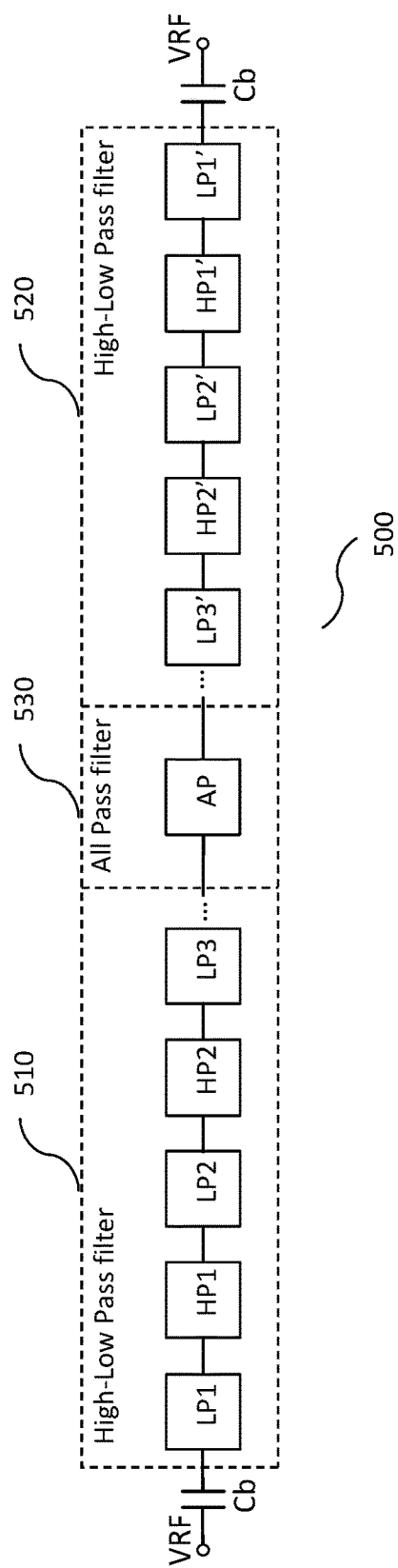
FIG. 5 is an analog phase shifter cascaded with multiple-stage high-low pass filters and an all-pass filter according to yet another embodiment of the invention.

FIG. 5 is an analog phase shifter 500 comprising a first multiple-stage HLP filter 510, a second multiple-stage HLP filter 520 and an all-pass filter 530 coupled in series according to yet another embodiment of the invention. The first HLP filter 510 and the second HLP filter 520 are cascaded filters comprising multiple high-pass (HP) sections and low-pass (LP) sections alternatively coupled in series, with a low-pass section in both ends. Such a configuration provides flexibility of selecting filter order number for each LP section and HPF section. Larger filter order number generally gives more bandwidth and phase shift range, although with traded-off of insertion loss. Similarly, more sections give more bandwidth and phase shift range, also with traded-off of insertion loss. Furthermore, the first and second HLP filters may be symmetrical/identical with LPF section interfacing external circuitry, such that the phase shifter may have improved matching and symmetrical S11/S22, thus is easier for circuit design and user applications.

The exemplary configurations in FIGS. 2-4, such as sharing a common DC source, coupling to respective DC source, incorporating wire bond inductor, incorporating high order filter configuration for selected HP/LP sections, etc., may also be applicable to the analog phase shifter 500 for additional benefits and flexibilities.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:
1. An analog phase shifter, comprising:
   a first high-low pass filter comprising a first low-pass filter (LPF) section, a second LPF section, and a first high-pass filter (HPF) section coupled in series between the first LPF section and the second LPF section, the first LPF section coupled to receive an RF input signal, the second LPF section outputs an output signal of the first high-low pass filter;
   an all-pass filter (APF) coupled to receive the output signal of the first high-low pass filter and output an APF output signal;
   a second high-low pass filter comprising a third LPF section, a fourth LPF section, and a second HPF section coupled in series between the third LPF section and fourth LPF section, the third LPF section coupled to receive the APF output signal, the fourth LPF section outputs an RF output signal.
2. The analog phase shifter of claim 1, wherein the first LPF section and the fourth LPF section are symmetrical around the APF, the second LPF section and the third LPF section are symmetrical around the APF.
3. The analog phase shifter of claim 1, wherein the first and second high-low pass filters comprise multiple LPF and HPF sections cascaded in series and alternatively.
4. The analog phase shifter of claim 1, wherein the second LPF section and the third LPF section are high-order low pass filter.
5. The analog phase shifter of claim 1, wherein the first high-low pass filter and the second high-low pass filter are symmetrical around the all-pass filter.
6. The analog phase shifter of claim 1, wherein the first high-low pass filter, the APF, and the second high-low pass filter are coupled to receive a common DC tuning signal for tuning.
7. The analog phase shifter of claim 1, wherein the first high-low pass filter, the APF, and the second high-low pass filter are each coupled to receive an individual DC tuning signal.
8. The analog phase shifter of claim 7, wherein the first high-low pass filter, the APF, and the second high-low pass filter are each coupled to receive the individual DC tuning signal via the bias resistor and an inductor coupled in series to the bias resistor.

9. A method for RF signal phase shifting, comprising:
receiving an input RF signal, at a first high-low pass filter, the first high-low filter comprising a first low-pass filter (LPF) section, a first high-pass filter (HPF) section and a second LPF section sequentially coupled in series, the first LPF section facilitates impedance match for the first high-low filter to receive the input RF signal;
receiving, at an all-pass filter (APF), an output signal of the first high-low pass filter from the second LPF section;
receiving, at a second high-low pass filter, an output of the APF, the second high-low filter comprising a third low-pass filter (LPF) section, a second HPF section, and a fourth LPF section sequentially coupled in series, the third LPF section facilitates a match between the second high-low pass filter and the APF; and
outputting an RF output signal from the fourth LPF section of the second high-low pass filter.

10. The method of claim 9, wherein the first high-low pass filter, the APF, and the second high-low pass filter are tunable and coupled to receive a common DC tuning signal for tuning.

11. The method of claim 9, wherein the first high-low pass filter, the APF, and the second high-low pass filter are tunable and each coupled to receive an individual DC tuning signal.

12. An analog phase shifter, comprising:
a front-end filter receiving an input RF signal via a front-end input interface and outputting a front-end output RF signal, the front-end input interface facilitating impedance match for the front-end filter to receive the input RF signal;
an all-pass filter (APF) coupled to receive the front-end output RF signal and output an APF output signal; and
a back-end filter coupled to receive the APF output signal via a back-end input interface and output an output RF signal, the back-end input interface facilitating a match between the APF and the back-end filter, at least one of the front-end filter, the APF, and the back-end filter being tunable to control phase shift of the output RF signal with reference to the input RF signal over a range of frequencies.

13. The analog phase shifter of claim 12, wherein the front-end filter outputs the front-end output RF signal via a front-end output interface to facilitate a match between the front-end filter and the APF.

14. The analog phase shifter of claim 12, wherein front-end input interface and the front-end output interface are low-pass filters.

15. The analog phase shifter of claim 14, wherein the front-end filter further comprises a front-end high pass filter coupled between the front-end input interface and the front-end output interface.

16. The analog phase shifter of claim 12, wherein the back-end filter outputs the output RF signal via a back-end output interface to facilitate impedance match for the back-end filter to output the output RF signal.

17. The analog phase shifter of claim 16, wherein back-end input interface and the back-end output interface are low-pass filters.

18. The analog phase shifter of claim 17, wherein the back-end filter further comprises a back-end high pass filter coupled between the back-end input interface and the back-end output interface.

19. The analog phase shifter of claim 12, wherein the front-end filter, the APF, and the back-end filter are coupled to receive a common DC tuning signal for filter tuning.

20. The analog phase shifter of claim 12, wherein the front-end filter, the APF, and the back-end filter are each coupled to receive an individual DC tuning signal for filter tuning.

* * * * *